United States Patent [19]

O'Toole et al.

[11] Patent Number: 4,586,170
[45] Date of Patent: Apr. 29, 1986

[54] SEMICONDUCTOR MEMORY REDUNDANT ELEMENT IDENTIFICATION CIRCUIT

[75] Inventors: James E. O'Toole; Robert J. Proebsting, both of Carrollton, Tex.

[73] Assignee: Thomson Components-Mostek Corporation, Carrollton, Tex.

[21] Appl. No.: 600,208

[22] Filed: Apr. 16, 1984

Related U.S. Application Data

[63] Continuation of Ser. No. 275,058, filed as PCT US81/00137, Feb. 2, 1981 published as WO 82/02793, Aug. 19, 1982, § 102(e) date Feb. 2, 1981, abandoned.

[51] Int. Cl.[4] .............................................. G11C 13/00
[52] U.S. Cl. ....................................... 365/200; 371/10
[58] Field of Search ................... 365/200, 210; 371/8, 371/10, 22, 29

[56] References Cited

U.S. PATENT DOCUMENTS

| | | | |
|---|---|---|---|
| 3,434,116 | 3/1969 | Anaker | 365/189 |
| 3,654,610 | 4/1972 | Sander et al. | 365/189 |
| 3,735,368 | 5/1973 | Beausoceil | 365/200 |
| 3,940,740 | 2/1976 | Coontz | 365/200 |
| 4,066,880 | 1/1978 | Salley | 365/189 |
| 4,092,733 | 5/1978 | Coontz et al. | 365/200 |
| 4,281,398 | 7/1981 | McKenny et al. | 365/200 |
| 4,346,459 | 8/1982 | Sud et al. | 365/200 |

*Primary Examiner*—Terrell W. Fears

[57] ABSTRACT

A test circuit (10) for a semiconductor memory is provided. The semiconductor memory includes a redundant decoder (70) for receiving memory address signals (66, 68) which is connected to a redundant circuit element via a signal line (72). The redundant decoder (70) can be programmed in accordance with the address of a defective circuit element, such that when the decoder (70) is addressed by the memory address signals (66, 68) the decoder (70) selects a predetermined redundant circuit element. The test circuit (10) generates an output signal (14) indicating that the circuit element selected by the decoder (70) is a redundant circuit element. The output signal (14) is applied to an indicator circuit (16) which is enabled in a test mode by an abnormal condition detector (26). The output (18) of indicator circuit (16) is applied to an external pin (20).

20 Claims, 5 Drawing Figures

SEMICONDUCTOR MEMORY REDUNDANT ELEMENT IDENTIFICATION CIRCUIT

This application is a continuation of Ser. No. 06/275,058 filed as PCT US81/00137 on Feb. 2, 1981, published as WO82/02793 on Aug. 19, 1982, § 102(e) date Feb. 2, 1981, and now abandoned.

TECHNICAL FIELD

This invention relates to semiconductor circuits, and more particularly to a redundant element identification circuit.

BACKGROUND ART

Integrated circuit semiconductor memories must, of necessity, operate with a high degree of reliability in order to be used in computer related applications. The production of errors on even infrequent occasions can cause serious problems in computer controlled operations and data processing. The nature of MOSFET (metal-oxidesemiconductor field-effect transistor) memories is such that error conditions are not always consistent but frequently occur only under unique circumstances. In mass produced memory circuits, certain ones of the memory elements will have greater resistance to error conditions while others will be more prone to the generation of errors.

Large scale integration techniques have brought about the construction of large arrays of binary storage elements on a single chip of silicon. Such techniques and mass production of memory circuits have brought about high packing densities of such semiconductor memories. With this increase in packing density, the susceptibility to manufacturing defects and error conditions also increases. In order to improve the yield in the manufacturing process of semiconductor memories, redundant circuit elements have been fabricated, together with the normal circuit elements on a single chip. The redundant elements can then be substituted for defective circuit elements. In this manner, the entire semiconductor memory need not be scrapped, since defective portions can be easily replaced with redundant circuit elements. The advantages of the use of redundant circuit elements include increased fabrication yield as well as lower production costs.

One of the problems encountered in using redundant circuit elements is that the topology of the semiconductor memory array is changed by the implementation of redundancy. The topological change introduces difficulty in testing the semiconductor memory for pattern sensitivity. It is frequently the case that a particular erroneous data output produced by a semiconductor memory is caused by the pattern of data elements stored in the vicinity of the cell which produced the erroneous data output. This condition is primarily due to the extremely small sizes of the memory elements and numerous interconnecting signal lines which tend to produce parasitic capacitances. Due to the vast number of data combinations possible with even a moderate sized memory, it is readily apparent that comprehensive pattern sensitivity testing is necessary.

In the testing of semiconductor memories, the determination of weak cells can be performed by a simple exercising of the memory array, such as by writing all ones into the array and reading back all ones. However, some failure modes are not detectable until a more complex addressing scheme is applied to the memory. Such schemes have been developed which include bouncing from a cell to all four of its adjacent cells and stepping through the array such as by writing the subject cell to a zero, writing the four adjacent cells to a one, and then reading the subject cell to determine if it has been disturbed.

Numerous standard test patterns have been developed for bouncing between certain address locations in order to try to cause a disturbed condition to detect weak cells. An important aspect of such test patterns is the knowledge of the exact physical location of each of the cells being addressed. With the use of redundant elements substituted for defective circuit elements, this knowledge of the exact physical location of the cell being addressed is normally lost. When substitution of a redundant row or column into the memory array is made, it is no longer possible to know which memory cells are located next to each other, such as adjacent rows or adjacent columns, since any one of the columns or any one of the rows could have been defective and substituted for by a redundant element. Therefore, pattern testing in semiconductor memories utilizing redundant elements normally does not fully test the memories for weak cells.

A need has thus arisen for an identification circuit for identifying the location of a redundant element which has been substituted for an original defective element in a semiconductor memory. Such an identification circuit will permit true topological testing since the exact physical location of each of the cells, whether an original cell or a redundant element, will be known.

DISCLOSURE OF THE INVENTION

In accordance with the present invention, an identification circuit is provided for use with a semiconductor memory utilizing redundant circuit elements.

In accordance with the present invention, in a semiconductor circuit having at least one redundant circuit element for substitution for an original circuit element and the circuit having an external pin, a test circuit is provided. The test circuit includes circuitry for indicating at an external circuit pin whether a redundant circuit element has been substituted for an original circuit element when the original circuit element is addressed.

In accordance with another aspect of the present invention, a semiconductor memory circuit is provided and includes a plurality of original circuit elements. A plurality of redundant circuit elements for substitution for ones of the plurality of original circuit elements is also provided. Circuitry is further provided for indicating whether one of the plurality of redundant circuit elements has been substituted for one of the plurality of original circuit elements when one of the plurality of original circuit elements is addressed.

In accordance with a further aspect of the present invention, a test circuit for a semiconductor memory having at least one redundant circuit element, wherein a redundant circuit element is substituted for a defective circuit element, is provided. The semiconductor memory circuit includes a programmable decoder for receiving memory address signals. The decoder is connected to the redundant circuit element. The decoder is programmed in accordance with the address of a defective circuit element, such that when the decoder is addressed by the memory address signals, the decoder selects its predetermined redundant circuit element. The test circuit, when enabled, detects the selection of the redundant circuit element and generates an output signal at an external circuit pin indicating that the circuit element selected by that particular combination of address inputs is a redundant circuit element.

BRIEF DESCRIPTION OF THE DRAWINGS

For a more complete understanding of the present invention and for further advantages thereof, reference will now be made to the following Detailed Description taken in conjunction with the accompanying Drawings in which.

DETAILED DESCRIPTION

Figure 1:
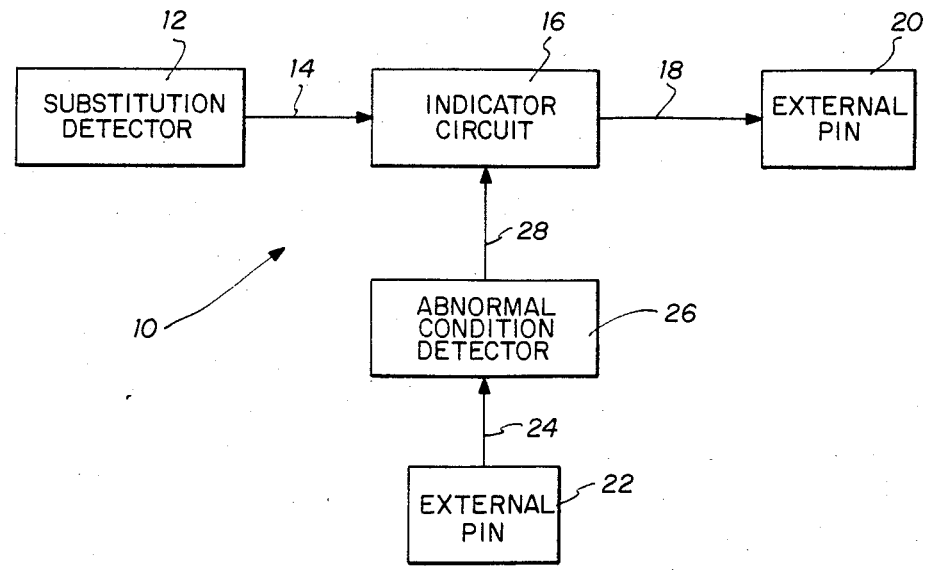
FIG. 1 is a block diagram of the present redundant element identification circuit.

Referring to FIG. 1, the redundant element identification circuit of the present invention is illustrated and is generally identified by the numeral 10. Identification circuit 10 may be utilized in numerous applications where redundancy techniques are implemented in semiconductor integrated circuits. A typical use of redundancy techniques involves semiconductor memory circuits. The implementation of the present identification circuit 10 in a semiconductor memory circuit is described herein with respect to FIGS. 3 and 4. As used herein, in connection with semiconductor memory circuits, the term "element" refers to, but is not limited to, a column or a row of a semiconductor memory array in addition to a bit or cell of a semiconductor memory. A redundant element, such as for example, a redundant row or column is a group of memory cells which can be substituted for a similar group that does not function properly. Typically, the redundant elements are fabricated within the same array as the regular, original, memory cells of a semiconductor memory array.

The present identification circuit 10 includes a substitution detector 12 which generates an output via signal line 14. Substitution detector 12 functions to detect the selection of a redundant circuit element in the semiconductor device. Substitution detector 12 will be subsequently described with respect to FIGS. 3 and 4. The output of substitution detector 12 is applied to an indicator circuit 16 which functions to selectively generate an output via a signal line 18 to an external pin 20 based on input conditions on signal lines 14 and 28. External pin 20 is accessible to the user of a semiconductor device and provides an indication signal that a redundant circuit element has been substituted for an original circuit element.

Identification circuit 10 further includes an external pin 22 which provides a signal via signal line 24 to an abnormal condition detector 26. Abnormal condition detector 26 detects the presence of a normally disallowed state on external pin 22 of the semiconductor circuit. The output of abnormal condition detector 26 is applied via signal line 28 to indicator circuit 16. Abnormal condition detector 26 functions to place identification circuit 10 in a test mode such that indicator circuit 16 is enabled to generate its output signal applied via signal line 18 to external pin 20.

Whereas external pin 20 and external pin 22 have been illustrated as being two separate pins of the semiconductor device, a single external pin may be utilized with the present identification circuit 10 such that signal line 24 would be interconnected to external pin 20. External pin 20 may comprise a pin of a semiconductor device having a different specified function or may comprise an otherwise unused pin on a semiconductor device. Furthermore, the normal operating function of external pin 20 may be disabled such that the output of indicator circuit 16 is applied to external pin 20 for indicating the substitution of a redundant circuit element. Alternatively, the function of external pin 20 may be unaffected by the output of indicator circuit 16 such that external pin 20 performs a dual function in operation of the semiconductor device utilizing the present identification circuit 10.

Figure 2:
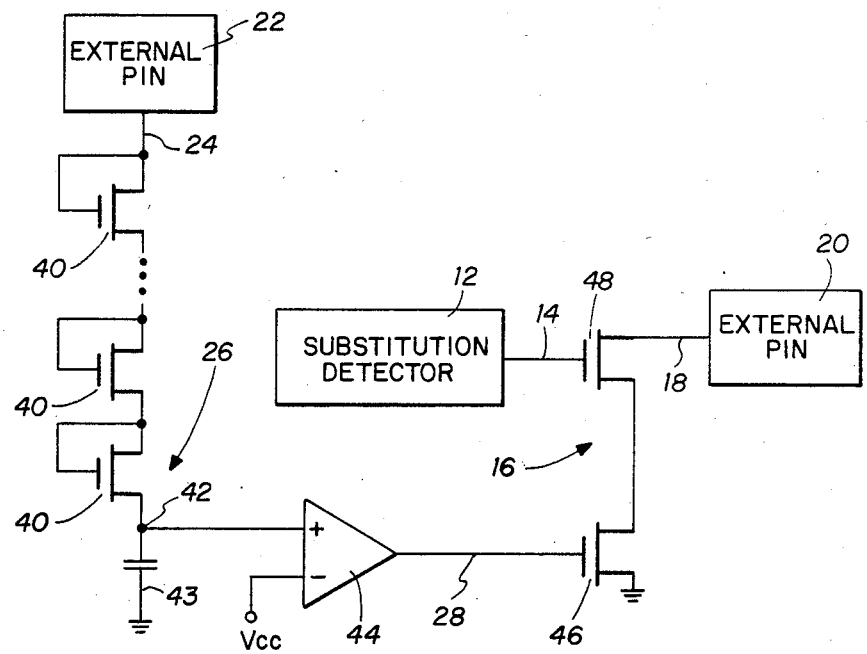
FIG. 2 is a schematic circuit diagram illustrating an example of the abnormal condition detector and indicator circuit shown in FIG. 1.

FIG. 2 illustrates typical circuitry for performing the functions carried out by indicator circuit 16 and abnormal condition detector 26. Abnormal condition detector 26 includes a plurality of diodes 40 serially interconnected between external pin 22 and a node 42. Interconnected between ground reference potential and node 42 is a capacitor 43. Abnormal condition detector 26 further includes a differential amplifier 44 wherein the noninverting input is interconnected to node 42 and the inverting input is interconnected to a supply source $V_{cc}$.

The application of an abnormally high signal on external pin 22 causes node 42 to charge to a voltage above $V_{cc}$ thereby causing the output of amplifier 44 to supply an output signal on signal line 28. The output signal of differential amplifier 44 is applied to a transistor 46 within indicator circuit 16. Transistor 46 is interconnected to a transistor 48 which receives the output of substitution detector 12. Indicator circuit 16 functions as an AND circuit for providing an output current via signal line 18 to external pin 20.

Figure 3:
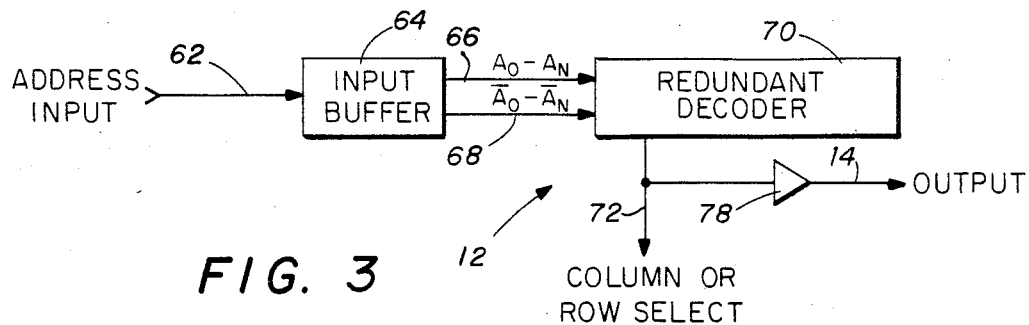
FIG. 3 is a block diagram illustrating the substitution detector shown in FIG. 1 for use in a semiconductor memory.

FIG. 3 illustrates a block diagram corresponding to substitution detector 12 utilized in a semiconductor memory. The semiconductor memory receives address inputs via signal lines 62 which are applied to input buffers 64. Input buffers 64 generate the true and complement signals, $A_0$-$A_N$ and $\overline{A_0\text{-}A_N}$ corresponding to the address input signals via signal lines 66 and 68. The outputs of input buffers 64 are applied via signal lines 66 and 68 to a redundant decoder 70, as well as the decoders associated with the semiconductor memory. In practice, there are as many address inputs 62 and input buffers 64 as required to uniquely select one of the rows and one of the columns of memory elements of the semiconductor memory array.

Redundant decoder 70 is associated with a unique redundant element of the semiconductor memory array. Redundant decoder 70 is programmed in accordance with the address of a particular original circuit element which has been determined to be defective, such that redundant decoder 70 will respond to one particular combination of address inputs 62 applied to the semiconductor memory to thereby generate a column or row select signal via signal line 72. This output signal selects and enables the redundant circuit element which has been substituted for an original element of the array which has been found to be defective. The output of redundant decoder 70 may further disable the defective element, such that the defective element does not interfere with the operation of the substituted redundant circuit element. Alternatively other techniques may be provided to ensure that the defective element does not interfere with the operation of the substituted circuit element.

The output of redundant decoder 70 is also applied to a buffer 78 which generates the output signal of substitution detector 12 (FIG. 1) via signal line 14 indicating that the element selected is, in fact, a redundant element. The information that a redundant element has been substituted for an original element provided by substitution detector 12 is made available to external pin 20 (FIG. 1) in the test mode through operation of detector 26 and indicator circuit 16.

In the test mode, the user can cycle through all possible combinations of element addresses, such as for example, columns, one at a time, for all element addresses of the semiconductor memory. When an address is reached that corresponds to an address of a redundant decoder 70, the output of buffer 78 will provide a signal indicating that the original circuit element was defective and has been substituted with a redundant circuit element. The output of buffer 78 will indicate a zero logic level if a regular or nonredundant address combination is applied to a redundant decoder 70. It therefore can be seen that the output via signal line 14 of buffer 78 will remain at a zero logic level if the addressed element is an original circuit element for which no substitution has been made and will go to a one logic level if a redundant element has been substituted.

Each redundant decoder 70 drives a single redundant element, such that a one-to-one correspondence exists between a redundant decoder 70 and a redundant element. Before programming, each redundant decoder 70 is deselected such that the output signal applied to buffer 78 is a logic low regardless of the address combination applied to redundant decoder 70.

Figure 4:
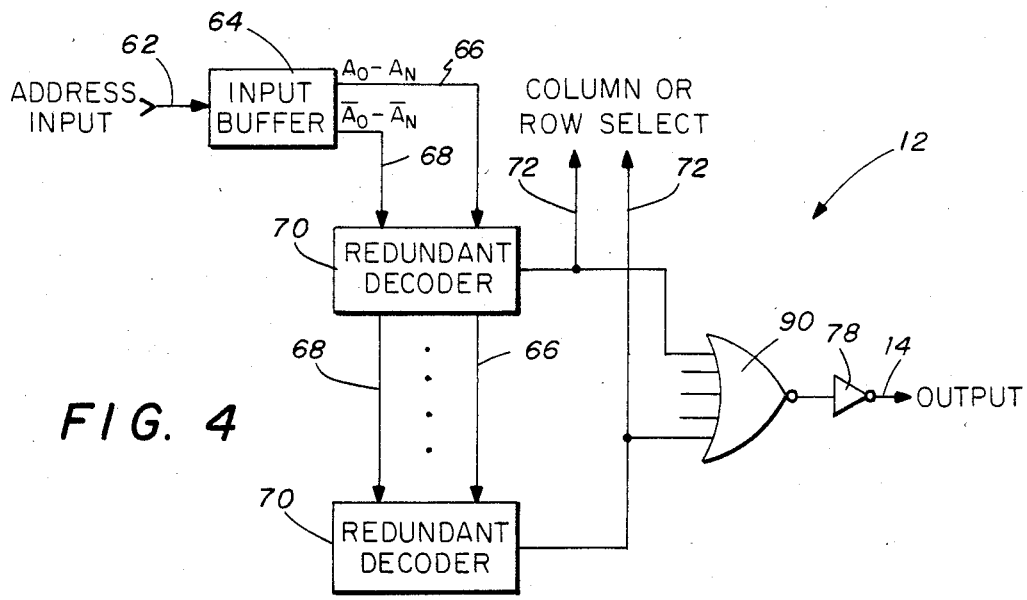
FIG. 4 is a block diagram of the substitution detector shown in FIG. 3 for use with multiple redundant elements in a semiconductor memory.

Referring to FIG. 4 wherein like numerals are utilized for like and corresponding components previously identified, use of substitution detector 12 (FIG. 3) for multiple redundant elements is illustrated. The outputs of multiple redundant decoders 70 can be combined in parallel in a NOR gate 90. The outputs of several such NOR gates 90 can further be inverted and combined in another NOR gate for further multiple redundancy. This later combination enables the use of multiple redundant elements physically located remote from each other on the layout of the semiconductor chip while conserving power, components and space for enabling identification circuit 10.

Figure 5:
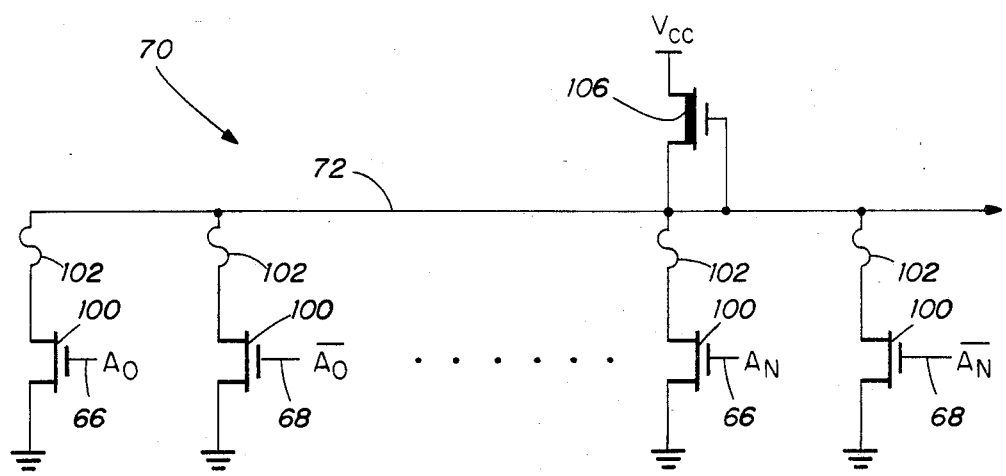
FIG. 5 is a schematic circuit diagram illustrating an example of a redundant decoder utilized with the substitution detector shown in FIGS. 3 and 4.

FIG. 5 illustrates a typical circuit for a redundant decoder 70. Redundant decoder 70 includes a plurality of transistors 100. The gate terminal of each transistor 100 is interconnected to one of the outputs of input buffers 64 (FIG. 3) via signal lines 66 or 68. All signal lines 66 and 68 are connected to each single redundant decoder 70 for all sets of possible address combinations to the semiconductor memory array. Regardless of the address combination on the input to unprogrammed redundant decoder 70, at least one transistor 100 in each pair will always be conducting. Therefore, the output of redundant decoder 70 via signal line 72 is always low and the redundant circuit element associated with a particular redundant decoder 70 is never selected.

The drain terminal of each transistor 100 is interconnected via a polysilicon fuse 102 to the output signal line 72. In order to program redundant decoder 70 to allow selection of a specific redundant element via signal line 72, one polysilicon fuse 102 in each pair of polysilicon fuses of a pair of transistors 100 is eliminated by, such as for example, laser or electrical programming techniques. The elimination of one of fuses 102 from a pair of transistors 100 is determined by which address combination is to be programmed into redundant decoder 70. Once programming has been accomplished, the specific address combination corresponding to low levels on signal lines 66 and 68 applied to those transistors 100 which remain interconnected to output signal line 72 will cause the output of redundant decoder 70 to go high, thereby selecting a redundant element.

Also interconnected to signal line 72 is a transistor 106. Transistor 106 is a depletion load device which pulls the voltage level on signal line 72 to the value of $V_{cc}$ so that when none of transistors 100 are actively holding signal line 72 low, load device 106 will pull signal line 72 to a high, to the value of $V_{cc}$. When the correct address combination is applied to redundant decoder 70 signal line 72 is pulled high, selecting the corresponding redundant element. When any other address combination is applied, at least one of the transistors 100 will be conducting current through transistor 106. The ratio of the sizes between transistor 106 and transistors 100 is such that signal line 72 will be pulled low.

It therefore can be seen that the present redundant element identification circuit 10 allows the determination of which elements, for example columns or rows of a semiconductor memory, are redundant columns or rows within a semiconductor memory array. The user by enabling identification circuit 10 in a test mode, and cycling through each element address can determine which addresses correspond to redundant elements by monitoring the external pin 20. The identification circuit of the present invention therefore facilitates the gathering of reliability data and allows true topological testing of semiconductor memory arrays.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. In a semiconductor integrated circuit having at least one redundant circuit element for substitution for an original circuit element, a test circuit comprising:
   means for indicating at an external pin of the semiconductor integrated circuit whether a redundant circuit element has been substituted for an original circuit element.

2. In a semiconductor integrated circuit having at least one redundant circuit element for substitution for an original circuit element, a test circuit comprising:
   means for indicating at an external pin of the semiconductor integrated circuit whether a redundant circuit element has been substituted for an original circuit element when the original circuit element is addressed.

3. The test circuit of claim 2 wherein the semiconductor integrated circuit comprises a semiconductor memory circuit and the original circuit elements comprise column signal lines and the memory bits associated with column signal lines.

4. The test circuit of claim 2 wherein the semiconductor integrated circuit comprises a semiconductor memory circuit and the original circuit elements comprise row signal lines and the memory bits associated with row signal lines.

5. The test circuit of claim 2 wherein the semiconductor integrated circuit comprises a semiconductor memory circuit and the original circuit elements comprise individual memory bits.

6. The test circuit of claim 2 wherein the semiconductor integrated circuit comprises a semiconductor memory circuit and the original circuit elements comprise column signal lines and row signal lines and the memory bits associated with column signal lines and row signal lines.

7. The test circuit of claim 2 wherein the semiconductor integrated circuit comprises a semiconductor memory circuit and the original circuit elements comprise column signal lines and the memory bits associated with column signal lines and individual memory bits.

8. The test circuit of claim 2 wherein the semiconductor integrated circuit comprises a semiconductor memory circuit and the original circuit elements comprise row signal lines and the memory bits associated with row signal lines and individual memory bits.

9. The test circuit of claim 2 wherein the semiconductor integrated circuit comprises a semiconductor memory circuit and the original circuit elements comprise column signal lines, row signal lines and the memory bits associated with column signal lines and row signal lines and individual memory bits.

10. A test circuit for a semiconductor memory integrated circuit having at least one redundant circuit element, the redundant circuit element being programmable to replace a defective circuit element, the memory being addressed with address signals and further having a redundant decoder programmed in accordance with the address of a defective circuit element for selecting a redundant circuit element and generating an output signal, the memory having external pins, comprising:
means for indicating the selection of a redundant circuit element on an exteral pin of the semiconductor memory integrated circuit.

11. The test circuit of claim 10 wherein said indicating means includes:
detector means responsive to the output signal for generating an indicator signal for application to the external pin.

12. The test circuit of claim 11 and further including:
means for applying said indicator signal to the external pin.

13. The test circuit of claim 10 wherein the external pin is not used for other memory signals.

14. The test circuit of claim 10 wherein the external pin is also used for other memory signals.

15. The test circuit of claim 10 wherein said means for indicating is enabled by an abnormal condition on one or more of the external pins.

16. The test circuit of claim 10 wherein the external circuit pin performs a specific function for the semiconductor circuit and said means for indicating disables the specific function for indicating the selection of a redundant circuit element on the external pin.

17. The test circuit of claim 10 wherein the external pin performs a specific function for the semiconductor integrated circuit and said means for indicating operates without disabling the specific function.

18. A test circuit for a semiconductor memory integrated circuit having at least one redundant circuit element, the redundant circuit element being programmed to replace a defective circuit element, the memory being addressed with address signals and further having a redundant decoder programmed in accordance with the address of a defective circuit element for selecting a redundant circuit element, the memory having external pins, comprising:
means connected to the decoder for indicating the selection of a redundant circuit element on an external pin of the semiconductor memory circuit.

19. In a semiconductor memory integrated circuit having a plurality of original circuit elements and a plurality of redundant circuit elements for substitution for ones of the plurality of original circuit elements and the memory receiving address signals and having an external pin, a test circuit comprising:
means for indicating at the external pin whether one of the plurality of redundant circuit elements has been substituted for a defective one of the plurality of original circuit elements when the defective one of the plurality of original circuit elements is addressed.

20. The test circuit of claim 19 wherein said indicating means includes:
decoder means programmed in accordance with the address of a defective one of the plurality of original circuit elements which has been substituted, said decoder means being addressed by the address signals and generating an output signal; and
detector means interconnected between said decoder and the external pin being responsive to said output signal for providing an indication at the external pin of the substitution of a redundant circuit element.

* * * * *